(12) United States Patent
Mohammadi-Gheidari et al.

(10) Patent No.: US 10,607,811 B1
(45) Date of Patent: Mar. 31, 2020

(54) MULTI-BEAM SCANNING TRANSMISSION CHARGED PARTICLE MICROSCOPE

(71) Applicant: FEI Company, Hillsboro, OR (US)

(72) Inventors: Ali Mohammadi-Gheidari, Best (NL); Ivan Lazić, Eindhoven (NL); Eric Bosch, Eindhoven (NL); Gerard van Veen, Waalre (NL)

(73) Assignee: FEI Company, Hillsboro, OR (US)

( * ) Notice: Subject to any disclaimer, the term of this patent is extended or adjusted under 35 U.S.C. 154(b) by 0 days.

(21) Appl. No.: 16/289,292

(22) Filed: Feb. 28, 2019

(51) Int. Cl.
| | |
|---|---|
| *H01J 37/00* | (2006.01) |
| *H01J 37/28* | (2006.01) |
| *H01J 37/244* | (2006.01) |
| *H01J 37/09* | (2006.01) |
| *H01J 37/147* | (2006.01) |

(52) U.S. Cl.
CPC .......... *H01J 37/28* (2013.01); *H01J 37/09* (2013.01); *H01J 37/1474* (2013.01); *H01J 37/244* (2013.01); *H01J 2237/0453* (2013.01); *H01J 2237/24578* (2013.01)

(58) Field of Classification Search
CPC ........ H01J 37/28; H01J 37/09; H01J 37/1474; H01J 37/244; H01J 2237/0453; H01J 2237/24578
USPC ................. 250/306, 307, 310, 311
See application file for complete search history.

(56) References Cited

U.S. PATENT DOCUMENTS

| | | | |
|---|---|---|---|
| 2015/0069235 A1* | 3/2015 | Kemen | .............. H01J 37/10 250/311 |
| 2015/0243474 A1 | 8/2015 | Lazic et al. | |
| 2016/0307729 A1 | 10/2016 | Lazic et al. | |
| 2017/0025247 A1 | 1/2017 | Stevens et al. | |

* cited by examiner

*Primary Examiner* — Michael Maskell

(57) ABSTRACT

Techniques for multi-beam scanning transmission charged particle microscopy are disclosed herein. An example apparatus at least includes a charged particle beam column to produce a plurality of charged particle beams and irradiate a specimen with each of the plurality of charged particle beams, and an imaging system to collect charged particles of each of the charged particle beams of the plurality of charged particle beams that traverse the specimen during said irradiation, and to direct each charged particle beam of the plurality of the charged particle beams after traversing the sample onto a detector, where each charged particle beam includes a barycenter, and where the detector is disposed in an intermediate location between a back focal plane and an imaging plane of the imaging system.

12 Claims, 2 Drawing Sheets

MULTI-BEAM SCANNING TRANSMISSION CHARGED PARTICLE MICROSCOPE

FIELD OF THE INVENTION

The techniques disclosed herein generally relate to the field of electron microscopy, and more specifically, in some embodiments, to multi-beam scanning transmission electron microscopy.

BACKGROUND OF THE INVENTION

Electron microscopy comes in a number of types, with each type having positive and negatives. The positives and negatives may, in some instances, determine what type of electron microscopy may be used. A few example types include scanning electron microscopy, transmission electron microscopy, scanning transmission electron microscopy, to name a few. Each of the mentioned types have specific negatives that, if overcome, may increase their adoption. For example, scanning transmission electron microscopy suffers from throughput, to name one example downside, that if adequately addressed, may increase its adoption.

BRIEF DESCRIPTION OF THE DRAWINGS

Like reference numerals refer to corresponding parts throughout the several views of the drawings.

DETAILED DESCRIPTION OF EMBODIMENTS

Figure 1:
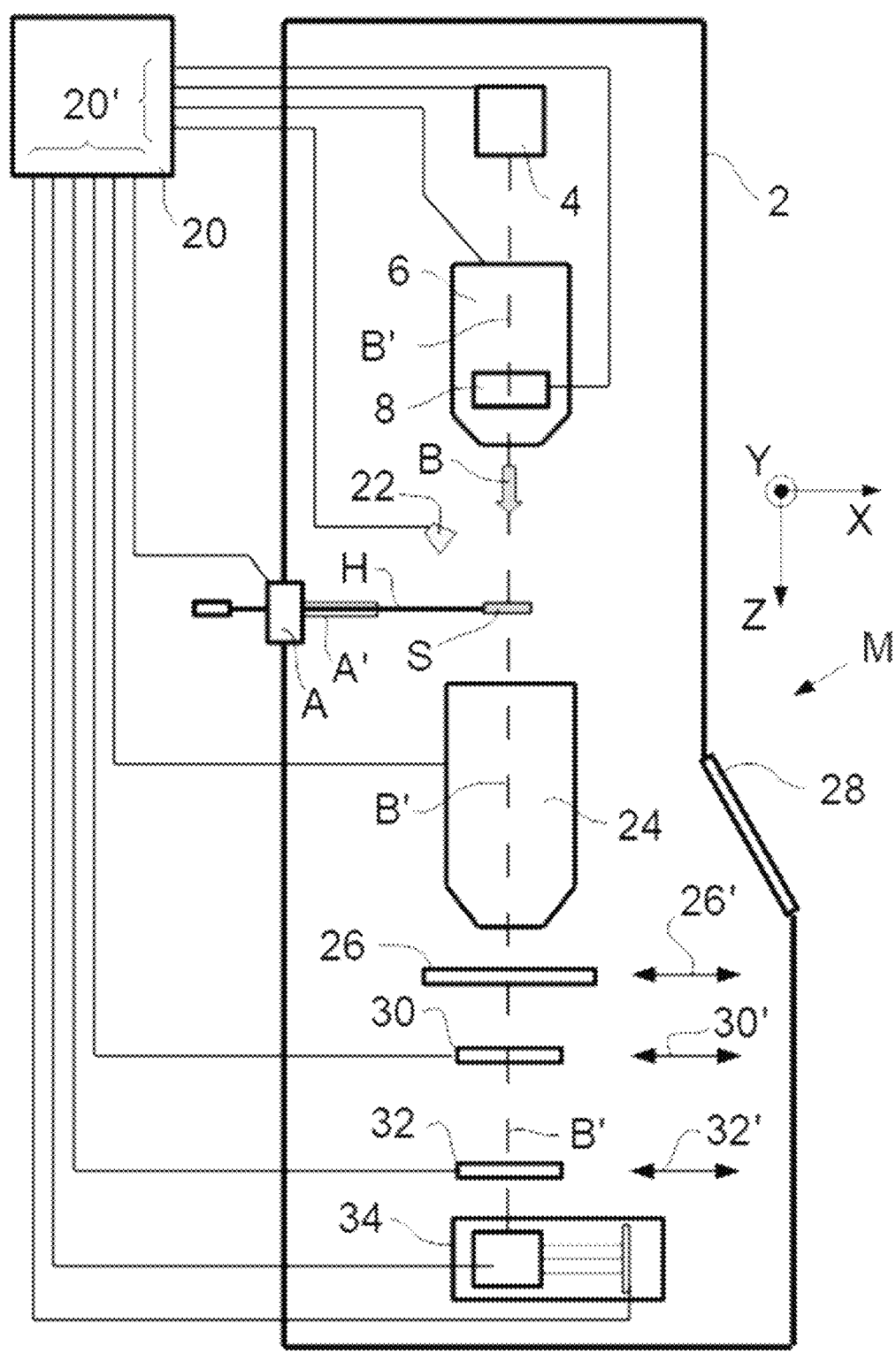
FIG. 1 is a highly schematic depiction of an embodiment of an STCPM in which the disclosed techniques can be implemented.

As used in this application and in the claims, the singular forms "a," "an," and "the" include the plural forms unless the context clearly dictates otherwise. Additionally, the term "includes" means "comprises." Further, the term "coupled" does not exclude the presence of intermediate elements between the coupled items.

The systems, apparatus, and methods described herein should not be construed as limiting in any way. Instead, the present disclosure is directed toward all novel and non-obvious features and aspects of the various disclosed embodiments, alone and in various combinations and sub-combinations with one another. The disclosed systems, methods, and apparatus are not limited to any specific aspect or feature or combinations thereof, nor do the disclosed systems, methods, and apparatus require that any one or more specific advantages be present or problems be solved. Any theories of operation are to facilitate explanation, but the disclosed systems, methods, and apparatus are not limited to such theories of operation.

Although the operations of some of the disclosed methods are described in a particular sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed systems, methods, and apparatus can be used in conjunction with other systems, methods, and apparatus. Additionally, the description sometimes uses terms like "produce" and "provide" to describe the disclosed methods. These terms are high-level abstractions of the actual operations that are performed. The actual operations that correspond to these terms will vary depending on the particular implementation and are readily discernible by one of ordinary skill in the art.

In some examples, values, procedures, or apparatus' are referred to as "lowest", "best", "minimum," or the like. It will be appreciated that such descriptions are intended to indicate that a selection among many used functional alternatives can be made, and such selections need not be better, smaller, or otherwise preferable to other selections.

Charged-particle microscopy is a well-known and increasingly important technique for imaging microscopic objects, particularly in the form of electron microscopy. Historically, the basic genus of electron microscope has undergone evolution into a number of well-known apparatus species, such as the Transmission Electron Microscope (TEM), Scanning Electron Microscope (SEM), and Scanning Transmission Electron Microscope (STEM), and also into various sub-species, such as so-called "dual-beam" apparatus (e.g., a FIB-SEM), which additionally employ a "machining" Focused Ion Beam (FIB), allowing supportive activities such as ion-beam milling or Ion-Beam-Induced Deposition (IBID), for example.

In an SEM, irradiation of a specimen by a scanning electron beam precipitates emanation of "auxiliary" radiation from the specimen, in the form of secondary electrons, backscattered electrons, X-rays and cathodoluminescence (infrared, visible and/or ultraviolet photons), for example; one or more components of this emanating radiation are detected and used for image accumulation purposes.

In a TEM, the electron beam used to irradiate the specimen is chosen to be of a high-enough energy to penetrate the specimen (which, to this end, will generally be thinner than in the case of an SEM specimen); the transmitted electrons emanating from the specimen can then be used to create an image. When such a TEM is operated in scanning mode (thus becoming a STEM), the image in question will be accumulated during a scanning motion of the irradiating electron beam across the specimen. As an alternative to the use of electrons as irradiating beam, charged particle microscopy can also be performed using other species of charged particle. In this respect, the phrase "charged particle" should be broadly interpreted as encompassing electrons, positive ions (e.g., Ga or He ions), negative ions, protons and positrons, for instance.

It should also be noted that, in addition to imaging and performing (localized) surface modification (e.g., milling, etching, deposition, etc.), a charged particle microscope may also have other functionalities, such as performing spectroscopy, examining diffractograms, etc.

In all cases, a Charged Particle Microscope (CPM) will comprise at least the following components:

A particle source, such as a Schottky electron source or an ion source.

An illuminator (charged particle beam column), which serves to manipulate a "raw" radiation beam from the source and perform upon it operations such as focusing, aberration mitigation, cropping (with a diaphragm), filtering, etc. It will generally comprise one or more (charged-particle) lenses, and may comprise other types of (particle-)optical components as well. If desired, the illuminator can be provided with a deflector system that can cause the exit beam to perform a scanning motion across the specimen being investigated.

A specimen holder, on which a specimen under investigation can be held and positioned (e.g. tilted, rotated). If desired, this holder can be moved so as to effect scanning motion of the specimen with respect to the beam. In general, such a specimen holder will be connected to a positioning system. When designed to hold cryogenic specimens, the specimen holder can comprise means for maintaining said specimen at cryogenic temperatures, e.g. using an appropriately connected cryogen vat.

A detector (for detecting radiation emanating from an irradiated specimen), which may be unitary or compound/distributed in nature, and which can take many different forms, depending on the radiation being detected. Examples include photodiodes, CMOS detectors, CCD detectors, photovoltaic cells, X-ray detectors (such as Silicon Drift Detectors and Si(Li) detectors), etc. In general, a CPM may comprise several different types of detector, selections of which can be invoked in different situations.

In the case of a transmission-type microscope (such as a (S)TEM, for example), a CPM will additionally comprise:

An imaging system, which essentially takes charged particles that are transmitted through a specimen (plane) and directs (focuses) them onto analysis apparatus, such as a detection/imaging device, spectroscopic apparatus (such as an EELS device: EELS=Electron Energy-Loss Spectroscopy), etc. As with the illuminator referred to above, the imaging system may also perform other functions, such as aberration mitigation, cropping, filtering, etc., and it will generally comprise one or more charged-particle lenses and/or other types of particle-optical components.

In what follows, the techniques disclosed herein may, by way of example, sometimes be set forth in the specific context of electron microscopy; however, such setting is intended solely for clarity/illustrative purposes, and should not be interpreted as limiting.

STEM is a powerful mode of operation of a conventional TEM, whereby a focused electron beam is scanned over a thin specimen, and transmitted/scattered electrons with different scattering angles are then collected and converted to an image. Depending on the scattering angle of the transmitted electrons, they can generate a "bright field (BF)" signal, if the scattering stays within the beam opening angle, or "dark field (DF)" signal, if the scattering angle is larger than the beam opening angle. With the recent development (by the current assignee) of a new imaging technique—which can be referred to as Integrated Differential Phase Contrast (iDPC) imaging: see U.S. Pat. No. 9,312,098 and US 2016/0307729 A1, for example (incorporated herein by reference in its entirety and for all purposes)—STEM has received renewed interest as an imaging method. However, the throughput of the STEM technique can be sub-optimal for some applications. One of the reasons for this is that, in a high-resolution STEM, the probe/input beam current tends to be limited due to lens aberrations and Coulomb interactions. Furthermore, the Field of View (FoV) tends to be limited by off-axial aberrations of the imaging system. As demands on throughput become ever more challenging, such STEM shortcomings become an increasing source of frustration.

It is an object of the present disclosure to at least address the above identified issues. More specifically, it is an object of the present disclosure to describe an STCPM-based imaging technique that allows improved throughput compared to prior STCPM-based imaging techniques. Moreover, it is an object of the present disclosure that the techniques disclosed herein should have an augmented FoV relative to conventional techniques.

These and other objects are achieved in a microscope when:

The microscope is configured to produce a plurality of said charged particle beams and to concurrently irradiate these onto different regions of said specimen; and A detector, for detecting said plurality of charged particle beams after passing through a sample, is disposed in a detector plane intermediate between a Back Focal Plane (BFP) and an Imaging Plane (IP) of said imaging system, where the detector plane is at a location sufficient to provide determination and detection of a barycenter of each of the plurality of charged particle beams.

It should be noted that the detector may be an individual, free-standing detector module for each of the plurality of charged particle beams (e.g., a plurality of detector modules), or the detector may be a large, composite detector that detects each of the charged particle beams at a different area of the detector, for example.

The techniques disclosed herein address the throughput problem of STEM by using multiple probes/input beams to achieve a form of parallel processing: a presented surface of the specimen is basically subdivided into a matrix of conceptual "tiles/regions/areas", and each one of these tiles/regions/areas is concurrently imaged by a respective one of the plurality of beams—thus increasing the cumulative FoV as well as increasing throughput. However, in such an architecture a problem arises as regards the simultaneous detection of each of the STEM signals from respective input beams. Applying a "conventional" diffraction pattern detection method fails because the signals from multiple beams overlap at the diffraction plane (also referred to herein as the BFP) of the employed imaging system (objective lens) where (real or virtual) detectors/cameras would traditionally be located thus making it impossible to separate different signals from different beams. On the other hand, using detectors in the IP of the imaging system makes little sense, since one will essentially only form (non-overlapping) probe images at that location and can only detect the intensity of the probe(s) at that location. Being able to only detect the intensity of the probe image does not allow for determination of a barycenter.

The techniques of the present disclosure instead take the counter-intuitive step of locating detector(s) at an intermediate detector plane that is situated between the BFP and the IP of the imaging system. In this intermediate detector plane, the output beams originating from the plural input beams will be mutually separated, thus allowing discrete detection thereof; however, the patterns registered at this location are essentially a hybrid between a diffraction pattern and a probe image (somewhat analogous to a partial Fourier Transform/Fresnel Propagation of a true image), so that physical interpretation of the registered patterns would conventionally be considered challenging. Nevertheless, it has been discovered that such hybrid patterns can be used to form satisfactory imagery, e.g., via the abovementioned iDPC technique.

In general, it has been demonstrated that the position of the intensity barycenter (center of "mass" or spatial center of each beam emerging from the specimen) of each pattern is proportional to the local electric field potential to which the associated beam is subjected during its passage through the specimen. As a result, it does not matter what the pattern represents or how it looks, as long as its intensity barycenter can be determined. Put another way, regardless of how each pattern looks, it preserves angular information (via the position of its intensity barycenter) that can be used as a basis for image information. If a position-sensitive detector (such as a pixelated or segmented detector/camera) is used to register the pattern, then its barycenter can be relatively easily located using image recognition software, for example. Note that such a position-sensitive detector lies at the heart of the Differential Phase Contrast (DPC) technique, which derives information from the manner in which a beam footprint is displaced (across the detection surface of the detector) from a null/reference position, e.g., the manner in which a beam is (asymmetrically) divided among four or more detector quadrants/segments/zones. The aforementioned iDPC technique goes a step further, by converting the output from such a detector into a vector field, and performing a mathematical integration step thereupon; the iDPC technique is therefore also referred to as iVF (Integrated Vector Field) imaging.

As regards the relative scanning motion of the input beams and specimen, there are a variety of different ways in which this can be achieved. For example:

(i) In one possible ("mechanical scan") set-up, the employed scanning assembly comprises an actuator system for producing scanning motion of the specimen holder.

(ii) In an alternative ("beam scan") set-up, the beams are scanned relative to the specimen. To this end, for example a first beam deflector system, upstream of the specimen, is invoked to produce scanning motion of said plurality of beams relative to the specimen; and a second beam deflector system, downstream of the specimen and upstream of said detector plane, is used to nullify the scanning motion produced by said first beam deflector system.

Approach (i) is advantageous in that it is less complex/composite than approach (ii)—though it will require use of a specimen holder stage that is capable of accurately traversing a scan path; this does not have to present a technical hurdle, since sophisticated scanning stages are already used in fields such as lithography, and are available in many different implementations. Beam scanning is the more traditional approach used in single-beam CPMs (such as SEMs and STEMs), though the current disclosure may require its modification for plural beams. Needless to say, if desired, a hybrid of approaches (i) and (ii) may also be implemented, in which both types of scanning are employed. Note that, when using approach (ii) with a detector that is not located in a diffraction plane of the imaging system, scanning an input beam will result in an attendant scanning motion of the output beam falling upon the detector. If one performs a reference "zero measurement" without a specimen in place, then this "baseline" scanning effect can be subtracted from the detection results obtained with a specimen in place.

As regards the number of input beams used in the techniques disclosed herein, it should be emphasized that this is discretionary. On the one hand, the greater the number of beams, the greater the throughput enhancement that can be achieved; on the other hand, a greater number of beams will increase overall system complexity. The skilled artisan will be able to find a compromise between these competing effects, and choose a number that is appropriate to a given scenario/use case. For example, one could construct a system using 196 beams in a 14×14 array—though many other beam pluralities/configurations are possible.

The skilled person will also understand that if the detector plane used in the invention is selected too close to the BFP of the imaging system, the patterns corresponding to the various input beams may be insufficiently separated from one another to differentiate the barycenters of the various beams. On the other hand, if said detector plane is selected too close to the IP of the imaging system, the beam paths of the input beams will be very adequately separated from one another, but the registered "patterns" will tend toward rudimentary probe images so that a determination of the location and translation of their respective barycenters is not possible, which may cause the techniques disclosed herein to not be implementable. Between these extremal situations, the skilled person will be well able to select an appropriate detector plane location.

FIG. 1 is a highly schematic depiction of an embodiment of an STCPM M in which the disclosed techniques can be implemented; more specifically, it shows an embodiment of a TEM/STEM (though, in the context of the current disclosure, it could just as validly be an ion-based microscope, for example). In FIG. 1, within a vacuum enclosure 2, an electron source 4 produces a beam B of electrons that propagates along an electron-optical axis B' and traverses an electron-optical illuminator (charged particle beam column) 6, serving to direct/focus the electrons onto a chosen part of a specimen S (which may, for example, be (locally) thinned/planarized). Also depicted is a deflector 8, which (inter alia) can be used to effect scanning motion of the beam B.

The specimen S is held on a specimen holder H that can be positioned in multiple degrees of freedom by a positioning device/stage A, which moves a cradle A' into which holder H is (removably) affixed; for example, the specimen holder H may comprise a finger that can be moved (inter alia) in the XY plane (see the depicted Cartesian coordinate system; typically, motion parallel to Z and tilt about X/Y will also be possible). Such movement allows different parts of the specimen S to be illuminated/imaged/inspected by the electron beam B traveling along axis B' (in the Z direction), and/or allows scanning motion to be performed as an alternative to beam scanning. If desired, an optional cooling device (not depicted) can be brought into intimate thermal contact with the specimen holder H, so as to maintain it (and the specimen S thereupon) at cryogenic temperatures, for example.

The electron beam B will interact with the specimen S in such a manner as to cause various types of "stimulated" radiation to emanate from the specimen S, including (for example) secondary electrons, backscattered electrons, X-rays and optical radiation (cathodoluminescence). If desired, one or more of these radiation types can be detected with the aid of analysis device 22, which might be a combined scintillator/photomultiplier or EDX (Energy-Dispersive X-Ray Spectroscopy) module, for instance; in such a case, an image could be constructed using basically the same principle as in an SEM. However, alternatively or supplementally, one can study electrons that traverse (pass through) the specimen S, exit/emanate from it and continue to propagate (substantially, though generally with some deflection/scattering) along axis B'. Such a transmitted electron flux enters an imaging system (projection lens) 24, which will generally comprise a variety of electrostatic/magnetic lenses, deflectors, correctors (such as stigmators), etc. In normal (non-scanning) TEM mode, this imaging system 24 can focus the transmitted electron flux onto a fluorescent screen 26, which, if desired, can be retracted/withdrawn (as schematically indicated by arrows 26') so as to get it out of the way of axis B'. An image (or diffractogram) of (part of) the specimen S will be formed by imaging system 24 on screen 26, and this may be viewed through viewing port 28 located in a suitable part of a wall of enclosure 2. The retraction mechanism for screen 26 may, for example, be mechanical and/or electrical in nature, and is not depicted here.

As an alternative to viewing an image on screen 26, one can instead make use of the fact that the depth of focus of the electron flux leaving imaging system 24 is generally quite large (e.g., of the order of 1 meter). Consequently, various other types of analysis apparatus can be used downstream of screen 26, such as:

TEM camera 30. At TEM camera 30, the electron flux can form a static image (or diffractogram) that can be processed by controller/processor 20 and displayed on a display device (not depicted), such as a flat panel display, for example. When not required, TEM camera 30 can be retracted/withdrawn (as schematically indicated by arrows 30') so as to get it out of the way of axis B'.

STEM camera 32. An output from STEM camera 32 can be recorded as a function of (X,Y) scanning position of the beam B on the specimen S, and an image can be constructed that is a "map" of output from STEM camera 32 as a function of X,Y. STEM camera 32 can comprise a single pixel with a diameter of e.g. 20 mm, as opposed to the matrix of pixels characteristically present in TEM camera 30. Moreover, STEM camera 32 will generally have a much higher acquisition rate (e.g. $10^6$ points per second) than TEM camera 30 (e.g. $10^2$ images per second). Once again, when not required, STEM camera 32 can be retracted/withdrawn (as schematically indicated by arrows 32') so as to get it out of the way of axis B' (although such retraction would not be a necessity in the case of a donut-shaped annular dark field STEM camera 32, for example; in such a camera, a central hole would allow flux passage when the camera was not in use).

As an alternative to imaging using cameras 30 or 32, one can also invoke spectroscopic apparatus 34, which could be an EELS module, for example.

It should be noted that the order/location of items 30, 32 and 34 is not strict, and many possible variations are conceivable. For example, spectroscopic apparatus 34 can also be integrated into the imaging system 24.

Note that the controller (computer processor) 20 is connected to various illustrated components via control lines (buses) 20'. This controller 20 can provide a variety of functions, such as synchronizing actions, providing setpoints, processing signals, performing calculations, and displaying messages/information on a display device (not depicted). Needless to say, the (schematically depicted) controller 20 may be (partially) inside or outside the enclosure 2, and may have a unitary or composite structure, as desired.

The skilled artisan will understand that the interior of the enclosure 2 does not have to be kept at a strict vacuum; for example, in a so-called "Environmental TEM/STEM", a background atmosphere of a given gas is deliberately introduced/maintained within the enclosure 2. The skilled artisan will also understand that, in practice, it may be advantageous to confine the volume of enclosure 2 so that, where possible, it essentially hugs the axis B', taking the form of a small tube (e.g. of the order of 1 cm in diameter) through which the employed electron beam passes, but widening out to accommodate structures such as the source 4, specimen holder H, screen 26, TEM camera 30, STEM camera 32, spectroscopic apparatus 34, etc.

Figure 2:
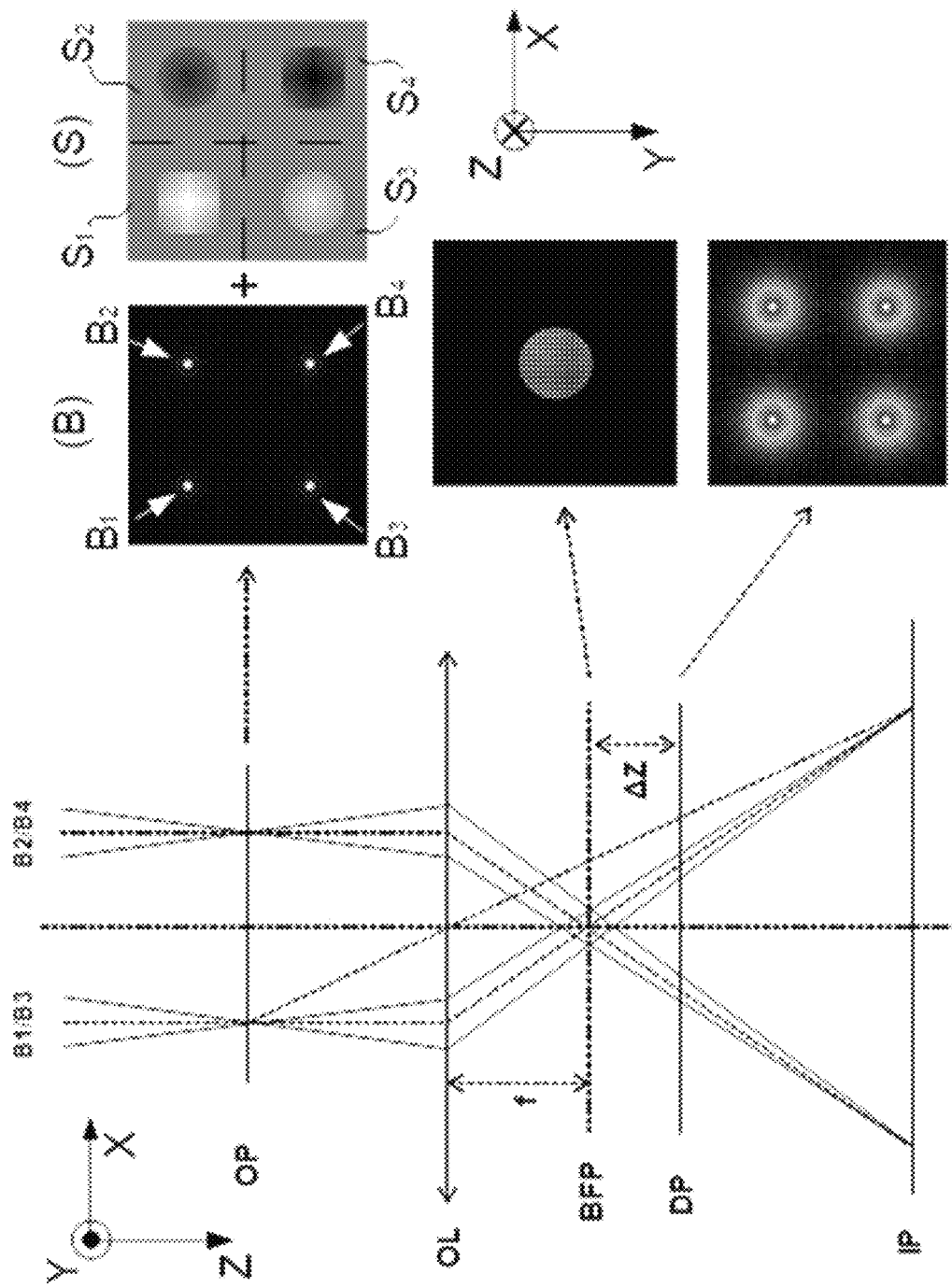
FIG. 2 illustrates an operating principle of an embodiment of the invention.

In the context of the present disclosure, a plurality of charged-particle beams is directed onto respective, different regions of specimen S, e.g. by using a suitable aperture plate (not depicted) to sub-divide the (progenitor) beam B into multiple (product) sub-beams. An example of such a situation is illustrated in FIG. 2, in which:

The left part of the Figure is a skeletal elevation view of relevant parts of FIG. 1, modified so as to produce multiple beams according to the disclosure;

The right part of the Figure shows plan views of the plural-beam cross-section at selected particle-optical planes along the Z axis.

In this particular example, the plural-beam architecture uses four input beams (B1, B2, B3, B4) arranged in a square quadrupole configuration; this, however, does not have to be the case, and different numbers and/or geometric arrangements of beams can be implemented and are contemplated herein. Turning now to the various parts of FIG. 2:

OP is an object plane of objective lens (imaging system) OL. At plane OP, each focused input beam will have a cross-section that has the form of a point or small disk, as illustrated in sub-drawing (B) at the right of the figure. The specimen S to be imaged will be disposed on this plane OP, and is schematically illustrated in sub-drawing (S) at the right of FIG. 2. As illustrated, the specimen S is conceptually sub-divided into four areas ($S_1$, $S_2$, $S_3$, $S_4$), to be respectively imaged by the corresponding beams ($B_1$, $B_2$, $B_3$, $B_4$). Specimen S will generally be inhomogeneous, so that the areas ($S_1$, $S_2$, $S_3$, $S_4$) will look mutually different.

BFP is the Back Focal Plane of objective lens OL. Note that, in this plane, the beams ($B_1$, $B_2$, $B_3$, $B_4$) have overlapping paths, so that the patterned information carried by each of the beams will also overlap and be co-incident on the same location as illustrated on the right of the Figure by a large central "blob". The plane BFP is separated from the objective lens OL by focal length f. At this location along Z, the barycenter of each beam $B_1$, $B_2$, $B_3$, and $B_4$ will not be individually discernable due to their overlap so that the techniques disclosed herein may not be applicable if a detector is located here.

IP is the Image Plane of objective lens OL. In plane IP, each of the beams ($B_1$, $B_2$, $B_3$, $B_4$) is focused to a spot/small disc, analogous to the situation in plane OP. Similarly, at this location along Z, the barycenter of each beam $B_1$, $B_2$, $B_3$, and $B_4$ will not be individually discernable due to the probe image make-up, e.g., the spot/small disc, so that the techniques disclosed herein may not be applicable.

DP is the intermediate detector plane, according to the present disclosure, disposed (along Z) between planes BFP and IP. DP is displaced from plane BFP by an amount $\Delta Z$. In this plane DP, the beams ($B_1$, $B_2$, $B_3$, $B_4$) will be mutually separated—illustrated in the bottom right image of FIG. 2 by four distinct patterns, which can be individually registered by a corresponding plurality of component detectors whose detection surfaces are disposed in plane DP; note that, as set forth above, these component detectors may, in fact, be different zones of a single, composite detection surface, e.g., as present in a camera. In each detected pattern, an intensity barycenter can be identified, and its position used to construct (for example) an iPDC image of the specimen S. In a non-limiting example, the plane DP is located at a Z-position corresponding to a position where the BF discs (with a well-defined size in the BFP) of two neighboring beams are separated by a distance approximately equal to twice a BF (bright field) disc radius ($R_{BF}$), so that neighboring barycenters are separated in X or Y by ca. $4*R_{BF}$.

Having described and illustrated the principles of the disclosed technology with reference to the illustrated embodiments, it will be recognized that the illustrated embodiments can be modified in arrangement and detail without departing from such principles. For instance, elements of the illustrated embodiments shown in software may be implemented in hardware and vice-versa. Also, the technologies from any example can be combined with the technologies described in any one or more of the other examples. It will be appreciated that procedures and functions such as those described with reference to the illustrated examples can be implemented in a single hardware or software module, or separate modules can be provided. The particular arrangements above are provided for convenient illustration, and other arrangements can be used.

In view of the many possible embodiments to which the principles of the disclosed technology may be applied, it should be recognized that the illustrated embodiments are only representative examples and should not be taken as limiting the scope of the disclosure. Alternatives specifically addressed in these sections are merely exemplary and do not constitute all possible alternatives to the embodiments described herein. For instance, various components of systems described herein may be combined in function and use. We therefore claim all that comes within the scope of the appended claims.

What is claimed is:

1. A Scanning Transmission Charged Particle Microscope comprising:
    a charged particle beam column to produce a plurality of charged particle beams and irradiate a specimen with each of the plurality of charged particle beams;
    a scanning assembly to produce relative scanning motion of the plurality of charged particle beams with respect to the specimen; and
    an imaging system to collect charged particles of each of the charged particle beams of the plurality of charged particle beams that traverse the specimen during said irradiation, and to direct each charged particle beam of the plurality of the charged particle beams after traversing the sample onto a detector,
        wherein each charged particle beam of the plurality of charged particle beams includes a barycenter, and
        wherein the detector is disposed in an intermediate location between a back focal plane and an imaging plane of the imaging system, the intermediate location bounded by a coincident location of the plurality of charged particle beams and a location where the barycenter of each charged particle beam is no longer distinguishable.

2. The microscope according to claim 1, wherein the detector is selected from the group comprising a Bright Field detector, a Dark Field detector, a position-sensitive detector, and combinations hereof.

3. The microscope according to claim 2, wherein:
    the detector is a position-sensitive detector; and
    a controller included in the microscope is configured to:
        generate, based on an output from said position-sensitive detector, a vector field; and
        apply a two-dimensional integration operation to said vector field.

4. The microscope of claim 1, wherein said scanning assembly comprises an actuator system for producing scanning motion of the specimen holder.

5. The microscope of claim 1, wherein said scanning assembly comprises:
    a first beam deflector system, upstream of the specimen, for producing scanning motion of said plurality of beams; and
    a second beam deflector system, downstream of the specimen and upstream of said detector plane, for nullifying the scanning motion produced by said first beam deflector system.

6. The microscope of claim 1, wherein said plurality of charged particle beams is generated by directing a progenitor charged particle beam onto an aperture plate having a plurality of openings within a footprint of the progenitor beam.

7. The microscope of claim 1, wherein said plurality of charged particle beams is produced by a plurality of charged particle beam columns.

8. The microscope of claim 1, wherein the intermediate plan is located such that neighboring barycenters of the plurality of charged particle beams are separated in the intermediate plane by at least twice a diameter of a profile of the charged particle beams.

9. The microscope of claim 1, wherein the intermediate plane is further bounded in the back focal plane direction by a location where the plurality of charged particle beams have emerged sufficiently from the coincident location so that individual charged particle beams and their respective barycenters are individually detectable.

10. The microscope of claim 1, wherein the intermediate plane is further bounded in the imaging plane direction by a location where the barycenter of each of the plurality of charged particle beams is still detectable.

11. A method of using a Scanning Transmission Charged Particle Microscope, comprising:
    concurrently irradiating, with a plurality of charged particle beams, a specimen, wherein each charged particle beam of the plurality of charged particle beams irradiates a respective region of the sample;
    scanning the charged particle beam with respect to the specimen;
    collecting charged particles that traverse the specimen during said irradiation, and directing the collected charged particles onto a detector,
        wherein the detector is disposed in a detector plane intermediate between a back focal plane and an imaging plane of an imaging system, and
        wherein the intermediate location is bounded by a coincident location of the plurality of charged particle beams and by a location where a barycenter of each charged particle beam is no longer distinguishable.

12. The method of claim 11, wherein the intermediate location is located such that bright filed discs of at least two neighboring charged particle beams of the plurality of charged particle beams are separated by a distance of twice a bright field disc radius.

* * * * *